(12) United States Patent
Braun et al.

(10) Patent No.: US 7,304,484 B2
(45) Date of Patent: Dec. 4, 2007

(54) METHOD AND DEVICE FOR THE TEMPERATURE COMPENSATION OF A MEASURING BRIDGE

(75) Inventors: Augustin Braun, Karlsdorf-Neuthard (DE); Friedrich Bahnmüller, Karlsruhe (DE)

(73) Assignee: acam-messelectronic GmbH (DE)

( * ) Notice: Subject to any disclaimer, the term of this patent is extended or adjusted under 35 U.S.C. 154(b) by 0 days.

(21) Appl. No.: 11/380,547

(22) Filed: Apr. 27, 2006

(65) Prior Publication Data

US 2006/0250146 A1 Nov. 9, 2006

(30) Foreign Application Priority Data

May 6, 2005 (EP) .................................. 05009872

(51) Int. Cl.
*G01R 27/26* (2006.01)
(52) U.S. Cl. ...................... 324/670; 324/685; 324/725; 324/706
(58) Field of Classification Search ................. 324/670, 324/685, 725, 706
See application file for complete search history.

(56) References Cited

U.S. PATENT DOCUMENTS

| 4,176,556 | A | | 12/1979 | Takenaka | |
|---|---|---|---|---|---|
| 4,419,620 | A | * | 12/1983 | Kurtz et al. | 323/280 |
| 4,765,188 | A | * | 8/1988 | Krechmery et al. | 73/708 |
| 5,135,002 | A | * | 8/1992 | Kirchner et al. | 600/485 |
| 5,254,992 | A | * | 10/1993 | Keen et al. | 341/119 |
| 5,686,826 | A | * | 11/1997 | Kurtz et al. | 323/365 |
| 6,690,183 | B2 | * | 2/2004 | Braun | 324/711 |

| 2003/0030451 | A1 | 2/2003 | Braun |
|---|---|---|---|

FOREIGN PATENT DOCUMENTS

| CH | 687349 A5 | 11/1996 |
|---|---|---|
| EP | 0271827 A2 | 6/1988 |
| EP | 1251357 A1 | 10/2002 |
| EP | 1279964 A1 | 1/2003 |

OTHER PUBLICATIONS

Boylestad, Robert, Introductory Circuit Analysis, 5th edition, Merrill Publishing Co., 1972, p. 209-212.*
Gerrish, Howard, et al., Electricity and Electronics, Goodheart-Willcox Co. Publishers, 1980, p. 149.*
Turner, Rufus, et al., The Illustrated Dictionary of Electronics, 4th edition, TAB Professional Books Inc., 1988, p. 72 and 605.*
Sturzl, Wilheim, "Circuit Arrangement" German Patent No. 0271827 translation, PTO 06-6838, Sep. 2006.*
Leipold, Jorg, "Switching arrangement for measuring the temperature of a temperature-dependent resistor" German Patent No. 687349 A5 translation, PTO 06-6839, Sep. 2006.*

* cited by examiner

*Primary Examiner*—Anjan Deb
*Assistant Examiner*—Thomas Valone
(74) *Attorney, Agent, or Firm*—McGlew and Tuttle, P.C.

(57) ABSTRACT

A method for the temperature compensation of a resistance measuring bridge, such as in particular a Wheatstone bridge, is characterized in that a capacitor positioned between the input circuit and a resistance switching circuit of the Wheatstone bridge is successively discharge by means of at least one Wheatstone bridge resistor. In a device for the temperature compensation of a measuring bridge, particularly a Wheatstone bridge, having a measuring bridge and a compensating resistor in the input circuit, one or two switches are located in the resistance switching circuit branch of the measuring bridge as a contact point with the latter and a capacitor is located between the input circuit and the resistance switching circuit branch.

32 Claims, 4 Drawing Sheets

METHOD AND DEVICE FOR THE TEMPERATURE COMPENSATION OF A MEASURING BRIDGE

FIELD OF THE INVENTION

The invention relates to a method for the temperature compensation of a resistance measuring bridge, such as in particular Wheatstone bridge, as well as a device for the temperature compensation of a measuring bridge, particularly a Wheatstone bridge, with a measuring bridge and a compensating resistor in the input circuit.

BACKGROUND OF THE INVENTION

The measurement of resistances or resistors, particularly those formed by strain gauges, which for measurement purposes are arranged in the form of a measuring bridge, particularly a Wheatstone bridge, reveal a temperature variation, i.e. the resistance value changes with the temperature. A pressure cell or pressure sensor with such resistance strain gauges e.g. has as the pressure-sensitive element a silicon-based, thin diaphragm. If the latter is etched from the silicon body and locally provided with foreign atoms diffused in to or implanted in the silicon crystal, zones are formed with a modified conductivity appearing electrically as conductors or local resistors. As soon as a pressure acts through a pressure duct on the measuring cell, there is a deformation of the thin silicon diaphragm.

As a result of the internal forces which occur, the molecular structure of the crystal is reversibly modified. Particularly in the diffused in resistance regions pronounced potential shifts occur in the crystal and lead to a measurable change of the electrical values. Through the wiring of the local resistance regions as a measuring bridge, when a voltage is applied pressure-dependent, electronic signals are obtained but, as stated, the resistance regions can have a temperature variation. Thus, the prior art method and device are consequently e.g. used in determining resistance values of such strain gauge arrangements and therefore for measuring strains, which are caused by forces, pressures, torques and weights and therefore for determining the latter quantities.

The aforementioned temperature variation of such sensors must be compensated in applications with a restricted temperature range (−10 . . . +40° C.), such as e.g. domestic or sales scales by adopting additional measures. For most industrial and also automotive applications the temperature range is higher (−40 . . . 125° C.) and the strain gauges must be carefully adapted to the field of use and are often provided with additional costs with a temperature measurement. In all cases production must be stable and reproducibly run in, so that the applications achieve the desired temperature variation without additional balancing measures. A subsequent balancing of the moulded measuring bridges is frequently no longer possible or gives rise to additional costs of a significant nature.

In the case of measuring bridges a constant voltage is applied across the bridge and a compensating resistor and the differential voltage between the bridge arms is measured.

The suppression of a thermal output signal without load is governed by the ratio formation of the resistors, but only if no differential voltage is applied at the bridge taps and consequently the balancing condition $R_1/R_3=R_2/R_4$ applies for the bridge resistors.

For example, the resistance value of all four resistors of a measuring bridge can change due to the thermal expansion of the bearing or contact surface. As, however, the thermal expansion uniformly applies to all four bridge resistors, the ratio of the resistors remains unchanged and consequently the balancing condition is fulfilled. With such bridges balancing resistors are introduced for the bridge zero balancing and are frequently mechanically balanced.

In the case of an unbalanced bridge with an expanded strain gauge further temperature dependences occur. With most resistors the gauge factor, i.e. the relationship between the expansion and the resulting resistance change, is temperature-dependent. With force measurements the modulus of elasticity, i.e. the relationship between the expansion of the bearing surface of the strain gauge and the measured force, is also temperature-dependent.

The temperature variation of the gauge factor or modulus of elasticity is not completely suppressed by the ratio formation of the resistance values in the case of a loaded Wheatstone bridge. A temperature-dependent and unbalance-dependent error remains in the measured bridge differential voltage, the so-called span error.

A method frequently used nowadays for minimizing the span error is the introduction of one or two series resistors into the voltage supply of the bridge. These series resistors have a temperature dependence which is opposed to that of the span error and e.g. with rising temperature as a result of the resistance increase reduces the effective bridge voltage and consequently keeps constant the bridge differential voltage. Very good results can be obtained with this method over a limited temperature range (e.g. −10° C. . . . +40° C.). However, for this purpose these compensating resistors must be adapted as precisely as possible to the circumstances of the strain gauges and load bodies.

In addition, due to unavoidable tolerances of the strain gauge resistors there is a bridge output signal without loading unless further balancing measures are taken, i.e. the offset error. To ensure that the span compensation does not lead to additional temperature-dependent offset errors, the bridge voltage without load must be balanced to very close to zero. If this was not the case, the bridge voltage reduction through the span resistance would reduce the offset voltage to the same extent. An offset voltage corrected to zero solely mathematically (e.g. in the connected microprocessor) would consequently fluctuate over the temperature.

In order to correct such errors the non-unbalanced, unloaded bridge voltage is balanced to zero volt and a matching compensating resistor is applied for compensating the bridge output signal. The electronics which then evaluate the bridge signal are not included in said balancing measures. A disadvantage of this procedure are the complicated, high demands made regarding the reproducibility and constancy of manufacture. In addition, the necessary balancing measures must be known prior to the manufacture of the measuring cells. Otherwise there would be a significant rise in the balancing costs following manufacture or a subsequent balancing is no longer possible.

It is also known for the subsequent balancing of the temperature variation through downstream electronics to measure both the differential voltage of the measuring bridge and the electrical voltage across the measuring bridge or a compensating resistor. Modern analog/digital converters (such as Cirrus CS5532, Melexis MLX90308) already have a further measuring channel for such a measurement.

A disadvantage of this method is the high input voltage range of the A/D converter between the potential of the compensation measurement and the bridge voltage potential. A high quality A/D converter with at least two measuring channels is required.

Thus, in this method there is an additional channel on the analog/digital converter and usually also an additional line to the measuring cell. This mathematical compensation method is rarely used due to the additional line and the increased demands on the A/D converter.

EP 1 251 357 A1 discloses the determination of resistances by measuring the discharge times of a capacitor across the same. Thus, in the case of temperature-dependent resistances or resistors temperature measurements can be carried out, if the temperature resistance characteristic is known, but there is no compensation of the temperature variation.

Based more particularly on the initially indicated prior art, the problem of the invention is to provide a method and a device with which account can be taken of and compensation can take place of a span error in measuring bridges, such as Wheatstone bridges, more particularly with strain gauges. A span error is not only caused by the resistors, but also by thermal expansion and the temperature variation of the modulus of elasticity of the bearing surface.

SUMMARY OF THE INVENTION

In the case of a method of the aforementioned type, the set problem is inventively solved in that a capacitor placed in parallel with the input circuit and a resistance switching circuit of the Wheatstone bridge is discharged successively across at least one Wheatstone bridge resistor. For solving the set problem, the invention also provides a device of the aforementioned type for performing the method and which is characterized in that in the resistance circuit branch of the measuring bridge a switch, but preferably two switches, are provided as a contact point with the measuring bridge and a capacitor is located between the input circuit and the resistance switching circuit branch.

The switches involved are electronic switches. The invention makes it possible in a simple manner to carry out a measurement on a conventional measuring bridge, such as a Wheatstone bridge circuit, without changes to the same and in this way permitting a compensation of the temperature variation of the span and the offset in post-processing. The temperature at the measuring bridge can be determined with the already provided resistance strain gauges and as a result there can be a complete temperature compensation without intervention in the bridge, so that the measuring bridge can be completely balanced after manufacture using simple means and without mechanical intervention. According to the invention, production or batch fluctuations can be subsequently compensated. The inventive device can be completely integrated into an integrated circuit, so that apart from the circuit implemented within a chip no external costs are involved.

There is no need for offset balancing elements. It is in particular possible to use unselected bridge resistors, because the balancing of the zero point can take place within the inventive scope of method evaluation, so that there are no balancing conditions for the bridge resistors. In particular, a single bridge can be completely balanced with a single temperature run and no mechanical intervention is necessary in the already applied bridge.

Bridges of a production batch can, at the end of production, be balanced on the basis of the temperature variation of a few samples. Production fluctuations of individual batches can consequently be subsequently compensated without any reworking of the bridges.

Further advantages of the inventive method and device from the production standpoint are that there is a reduction to demands concerning the reproducibility of manufacture and as a result of component selection there can be significant cost advantages due to the low demands made on the resistors. According to the invention, the balancing of a complete production line can take place subsequently without any mechanical intervention in the measuring bridges.

According to a preferred development of the inventive method, the capacitor is discharged until a switching threshold of a threshold switch is reached.

According to a preferred development of the inventive method, the discharge times of the capacitor can be determined across individual resistors or combinations of resistors of the measuring bridge.

According to a preferred development, the discharge times or discharge time components of the individual resistors of the measuring bridge can be brought into relationship with the capacitor. The ratio or unbalance $$(\Delta R / R) \text{ compensated} = \frac{t'_1}{t'_2}$$

is the measuring bridge output signal without the influence of the span-compensating series resistor. If the balancing condition $R_1/R_2 = R_3/R_4$ is fulfilled for measuring bridge resistors $R_1$ to $R_4$ and the bridge resistors are non-unbalanced or the measuring bridge is not loaded, for the aforementioned relative unbalance, the thermal output signal is suppressed and an unavoidable offset shift of the zero point plays no part, because no span compensation is applied.

According to another preferred development of the invention, for span compensation purposes the measuring bridge output signal is determined according to:

$$\left(\frac{\Delta R}{R}\right)_{span\text{-}compensated} = \left(\frac{t'_1}{t'_2} - \frac{t'_3}{t'_4} - TkO\right) \frac{1}{1 + TkS \frac{2 \cdot t_k}{t'_1 + t'_2}}$$

in which $t'_1, t'_2, t'_3, t'_4$ are the discharge times of the capacitor across the individual measuring bridge resistors, TkO the offset error of the non-unbalanced, unloaded measuring bridge, TkS a correction factor for the measuring bridge span error and $t_k$ the discharge time component of a compensating resistor located in the input circuit of the measuring bridge, so that as a result of a compensating resistor $R_k$ provided in the circuit following optional mathematical multiplication and therefore adaptations thereof a corrected compensation can be effected, so that incorrect balancing in the production can be corrected or in general production can be simplified, in that for the latter case use is only made of a roughly adapted compensating resistance and the latter is subsequently adapted mathematically or on a software basis. Thus, this reduces production costs without additional expenditure.

The measurement can take place with a normally already present compensating resistor or strain gauge without additional measurement expenditure in the sensor which can be used for digital correction purposes, so that subsequent interventions in the sensor can be avoided. Since, as stated, the compensating resistance need no longer be accurately adapted to the measuring bridge, for production or cost reasons higher or lower values than normal can be chosen.

There is also no need during production for precise knowledge of the compensating resistance, because the balancing of the temperature variation of the output signal takes place in connection with a downstream mathematical processing.

According to the aforementioned method an individual bridge can be completely balanced with a single temperature run by means of a mathematical adaptation of the correction factors of offset and span errors, without any mechanical intervention in the already applied bridge being necessary.

According to a further development of the invention, the correction factor for the measuring bridge span error is between ¾ and 1. Preferred specific values as a function of the precise circuitry are given hereinafter.

According to a preferred development of the invention, several capacitor discharge processes take place over different paths and different resistors or resistor combinations provided therein (series and/or parallel connection) and then in a preferred development the discharge time components of the individual measuring bridge resistors are determined by subtraction of the discharge time components of compensating resistors and possible resistors of analog switches across which the discharges have also taken place during the measurement of the discharge times across the measuring bridge resistors.

In a first specific development, the measurement of the discharge time times takes place in such a way that discharge times are determined across in each case one measuring bridge resistor and a compensating resistor in series therewith and the discharge times are determined across in each case one other measuring bridge resistor, the time constant of the compensating resistor being determined according to:

$$t_k = R_k * C = \frac{1}{2}((t_1+t_2)-(t_3+t_4))$$

In a first alternative development of this method, the capacitor is additionally discharged across the compensating resistor and the series connected, parallel resistors of the measuring bridge, the discharge time $$t_{12} = \left(\frac{R_1 R_2}{R_1 + R_2} + R_k\right) \cdot C$$

across the compensating resistor and the parallel measuring bridge resistors connected in parallel thereto being measured.

As an alternative the invention provides for the determination of the time constant of the compensating resistor as follows:

$$t_k = R_k C = 2 \cdot \left(t_{12} - \frac{t_1 t_2}{t_1 + t_2}\right)$$

According to another development of the invention, a capacitor positioned between the input circuit and the resistance switching circuit of the measuring bridge is successively discharged across a resistor of the measuring bridge and other resistors of the measuring bridge arranged in parallel thereto and an analog switch in series with the measuring bridge and in particular the discharge times are determined according to:

$$t_1 = (R'_1 + R_x + R_k) * C \text{ switches } S_x \text{ and } S_1' \text{ closed}$$

$$t_2 = (R'_2 + R_x + R_k) * C \text{ switches } S_x \text{ and } S_2' \text{ closed}$$

$$t_3 = (R'_3 + R_y) * C \text{ switches } S_y \text{ and } S_1' \text{ closed}$$

$$t_4 = (R'_4 + R_y) * C \text{ switches } S_y \text{ and } S_2' \text{ closed}$$

in which:

$$R'_1 = \frac{R_1 \cdot (R_2 + R_3 + R_4)}{R_1 + R_2 + R_3 + R_4} \quad R'_2 = \frac{R_2 \cdot (R_1 + R_3 + R_4)}{R_1 + R_2 + R_3 + R_4}$$

$$R'_3 = \frac{R_3 \cdot (R_1 + R_2 + R_4)}{R_1 + R_2 + R_3 + R_4} \quad R'_4 = \frac{R_4 \cdot (R_1 + R_2 + R_3)}{R_1 + R_2 + R_3 + R_4}$$

According to a further development, the value of the measuring bridge resistors is chosen as $R_1 + R_2 = R_3 + R_4$, resistors are $R_1$, $R_2$ forming one resistance switching circuit and resistors $R_3$, $R_4$ its parallel resistance circuit of the measuring bridge and the time constant of the compensating resistor is determined according to:

$$t_k = R_k * C = \frac{1}{2}((t_1+t_2)-(t_3+t_4))$$

Alternatively the capacitor can additionally be discharged across the compensating resistor, an analog switch with an on-resistor and the parallel-connected resistors $R_1$, $R_2$ in series therewith, the discharge time being determined according to:

$$t_{12} = \left(\frac{R_1 R_2}{R_1 + R_2} + R_k + R_x\right) \cdot C$$

and the time constant of the compensating resistor is determined according to:

$$t_k = R_k C = 3 \cdot \left(t_{12} - \frac{(5t_1 - t_2)(5t_2 - t_1)}{12 \cdot (t_1 + t_2)}\right) - t_x$$

For determining the discharge time components of the internal resistors of at least one analog switch, according to a first preferred development of the inventive method, the capacitor can be discharged across at least one analog switch with an on-resistor and successively with one of two discharge resistors connected in series therewith, whilst in particular measuring the discharge times $$t_{g1} = (R_{g1} + R_x) * C$$

$$t_{g1} = (R_{g2} + R_x) * C$$

and the discharge time of the capacitor across an analog switch with an on-resistor and two parallel-connected discharge resistors in series therewith.

According to a further development, the discharge time of the capacitor is measured across at least one analog switch with an on-resistor and two parallel-connected discharge resistors in series therewith according to:

$$t_{g1\text{-}g2} = \left(\frac{R_{g1} R_{g2}}{R_{g1} + R_{g2}} + R_x\right) \cdot C$$

the discharge time component being determined across the on-resistor of an analog switch according to:

$$t_x = R_xC = 2 \cdot \left(t_{g1-g2} - \frac{t_{g1}t_{g2}}{t_{g1}+t_{g2}}\right)$$

The thus determined discharge time component for the on-resistor of a first analog switch is sufficient for the further determination and in particular for compensation in the aforementioned manner.

Alternatively, it is additionally possible to determine the discharge time component of the on-resistor of a further analog switch, where firstly the capacitor is measured across an analog switch with an on-resistor and parallel-connected resistors $R_3$, $R_4$ of the measuring bridge in series therewith and the discharge time across the capacitor is measured by means of an analog switch with an on-resistor and parallel measuring bridge resistors $R_3$, $R_4$ in series therewith, according to:

$$t_{34} = \left(\frac{R_3R_4}{R_3+R_4} + R_y\right) \cdot C$$

and in particular the discharge time component of the on-resistor of the analog switch is determined according to:

$$t_y = R_yC = 3 \cdot \left(t_{34} - \frac{(5t_3-t_4)(5t_4-t_3)}{12 \cdot (t_3+t_4)}\right)$$

The inventive device for performing the last-mentioned method developments is so constructed that in the input circuit between a voltage supply and the measuring bridge is in each case provided an analog switch and preferably at least one analog switch is in series with discharge resistors and discharge switches.

Although it is fundamentally still possible for there to be at least one analog switch in series with two parallel discharge resistors, with which one switch is in each case associated in series, according to a preferred development each measuring bridge is connected across its own, associated, series-connected switch with the associated resistance circuit branch.

Further developments of the inventive device are characterized in that a switchable voltage supply is placed in the input circuit of the measuring bridge and/or in that a threshold switch is associated with the capacitor.

BRIEF DESCRIPTION OF THE DRAWINGS

Further advantages and features of the invention can be gathered from the claims and the subsequent description of embodiments of the invention with reference to the attached drawings, wherein show:

FIG. 1b The constructive implementation of the device of FIG. 1a.

DETAILED DESCRIPTION OF THE DRAWINGS

Figure 1A:
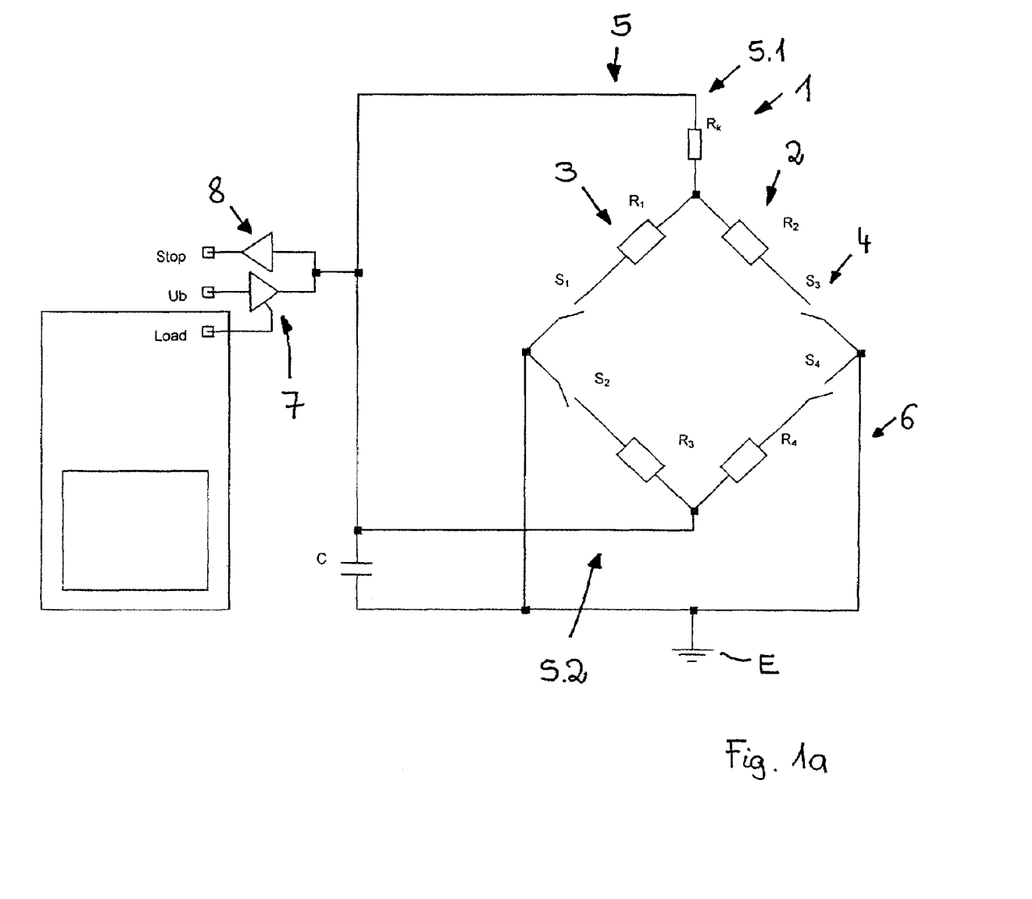
FIG. 1a A first embodiment of an inventive device for performing the inventive method for the temperature compensation of a Wheatstone bridge.

The inventive temperature compensation device 1 of a resistance bridge 2 in the form of a Wheatstone bridge has such a Wheatstone bridge 2 as a parallel connection of two resistance switching circuits 3, 4 with four resistors $R_1$, $R_2$, $R_3$, $R_4$, resistors $R_1$, $R_3$ forming the first resistance circuit 3 and resistors $R_2$, $R_4$ the second resistance circuit 4, an input voltage circuit 5 between resistors $R_1$ and $R_2$ or resistors $R_3$ and $R_4$, the resistance circuit branch 6 between resistors $R_1$ and $R_3$ on the one hand and resistors $R_2$ and $R_4$ on the other.

Resistors $R_1$ to $R_4$ can e.g. be strain gauges of a corresponding measuring bridge.

A processor V, preferably in the form of a computer, is provided for carrying out the necessary calculations and applications.

A switchable voltage supply 7 and a threshold switch 8 are located at input branch 5. In input branch 5.1 of input circuit 5 is provided a compensating resistor $R_k$. With each resistor $R_1$ to $R_4$ of Wheatstone bridge 2 is associated a switch $S_1$ to $S_4$ relative to resistance switching circuit branch 6. Between the output branch 5.2 of input circuit 5 and resistance circuit branch 6 is provided a capacitor C. The resistance circuit branch 6 is earthed or grounded at E.

Figure 1B:
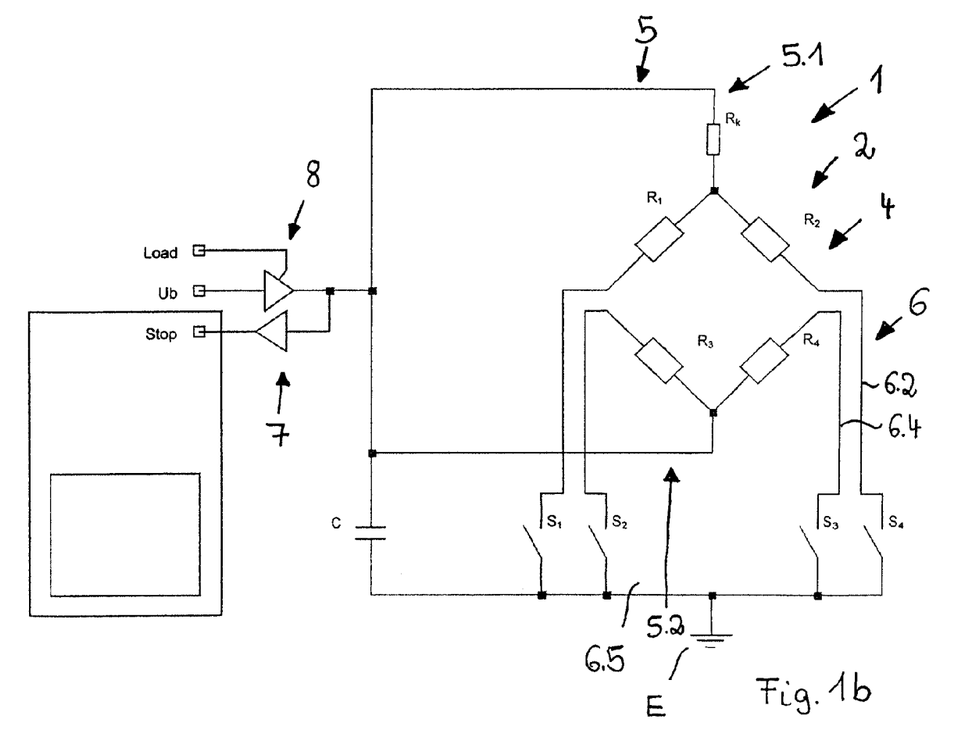

Whereas in FIG. 1a switches $S_1$ to $S_4$ are integrated into the Wheatstone bridge, FIG. 1b shows a construction in which the junctions of the resistors $R_1$, $R_3$ on the one hand and $R_2$, $R_4$ on the other are initially separated at the resistance circuit branches and are separately led out of the Wheatstone bridge or the chip incorporating the same as lines 6.1, 6.2, 6.3 and 6.4 and the switches $S_1$ to $S_4$ connect the same to earthed line 6.5 outside the Wheatstone bridge chip.

The latter offers the advantage that the separation in many cases can still take place on the applied Wheatstone bridge, if the connections between resistors $R_1$, $R_2$ and $R_3$, $R_4$ are freely accessible. Otherwise the new wiring, optionally also in the embodiment of FIG. 1a, is to take place prior to the moulding of the measuring bridges. There is always only a change to the wiring of the applied measuring bridge, the position on the workpiece remaining unchanged.

For performing the inventive method using the inventive device of FIGS. 1a and 1b, capacitor C is initially charged by voltage supply 6 with switches $S_1$ to $S_4$ open. Following each charging operation the capacitor is discharged by means of switches $S_1$ to $S_4$ successively across resistors $R_1$ to $R_4$ down to the switching threshold of threshold switch 7. In the case of the discharge across resistors $R_1$ and $R_2$, compensating resistor $R_k$ is additionally in series.

The measured discharge times are then:

$$t_1 = (R_1+R_k)*C$$

$$t_2 = (R_2+R_k)*C$$

$$t_3 = R_3*C$$

$$t_4 = R_4*C$$

If evaluation is limited to the measured times $t_1$ and $t_2$, for the special case $R_1=R_4$ and $R_2=R_3$, it applies that the temperature variation of the result is compensated identically to a conventional Wheatstone bridge.

For measurement purposes in connection with Wheatstone bridges, all four time measurements $t_1$ to $t_4$ must be introduced for the result. As in the measurements $t_3$ and $t_4$ the temperature variation compensation by $R_k$ is missing, a further extending temperature compensation is necessary.

As the compensating resistor $R_k$ is suitable for temperature compensation purposes, the time component $R_kC$, which gives rise to the compensating resistance during the discharge of resistors $R_1$ and $R_2$, is determined separately and used for a mathematical compensation.

The methods for determining $R_kC$ are described hereinafter for the calculation of the thermally compensated result and by illustrating the other devices and measuring methods.

Determining the compensating resistor without additional measurement

The time component $t_k=R_kC$ producing the compensating resistor $R_k$ is contained in the measurements $t_1$ and $t_2$.

Normally the resistors of a measuring bridge have the same rating, e.g. 350 Ohm or 1 kOhm, so that with adequate accuracy it is possible to assume:

$$R_1+R_2=R_3+R_4$$

When using strain gauges as the Wheatstone bridge this relationship is also assured in most cases for the applied measuring signal, because the resistances change pairwise, e.g. $R_1$ and $R_4$ are jointly expanded or $R_2$ and $R_3$ are jointly compressed.

On the basis of this coincidence, with the four measurements $t_1$, $t_2$, $t_3$, $t_4$ here it is directly possible to calculate the compensating resistor time constant $t_k$ with a simple difference formation:

$$t_k=R_k*C=\tfrac{1}{2}((t_1+t_2)-(t_3+t_4))$$

Thus, as a result of simple calculations no further circuitry measures are necessary in the bridge or electronics and no additional measurements are required.

Determination of the Compensating Resistor with Additional Measurement

The running time of a RC element is determined from the compensating resistor $R_k$ and discharge capacitor $C$.

Alternatively to the aforementioned determination of $t_k$, an additional discharge is performed, in that the charged capacitor is simultaneously discharged across electronic switches $S_1$ and $S_2$ (both simultaneously closed). As the discharge resistance results the parallel connection of resistors $R_1$ and $R_2$:

$$t_{12} = \left(\frac{R_1 R_2}{R_1 + R_2} + R_k\right) \cdot C$$

In all three measurements for $t_1$, $t_2$ and $t_{12}$ is contained the time constant $t_k=R_kC$ and it is possible to calculate without additional assumptions:

$$t_k = R_kC = 2\cdot\left(t_{12} - \frac{t_1 t_2}{t_1 + t_2}\right)$$

The formula for $t_k$ is an approximation of the exact solution, which is fully adequate for normal requirements.

Direct Connection of a Wheatstone Bridge

Figure 2:
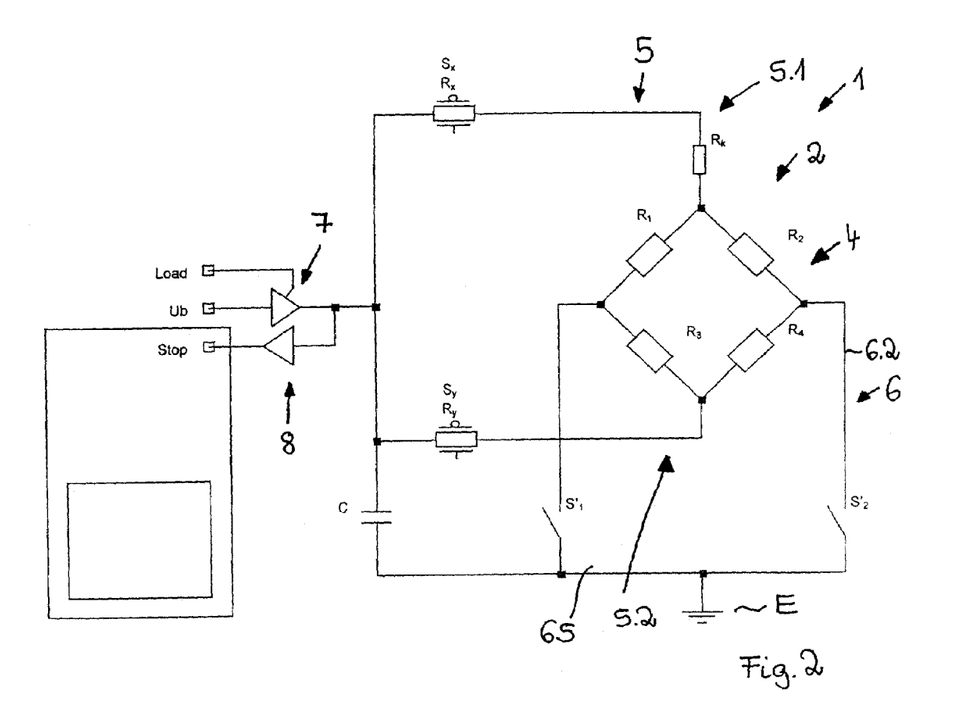
FIG. 2 Another development of the inventive temperature compensation device.

Most modern strain gauge applications make use of the Wheatstone bridge. Therefore advantages are attached to a method able to make use of existing sensors without any sensor modification, as shown in FIG. 2. This is also possible within the scope of the invention using two additional commercial analog switches $S_x$ and $S_y$ in the input branch 5.1 and output branch 5.2 of input circuit 5. Switches $S_x$ and $S_y$ have internal resistances $R_x$ and $R_y$. The switches $S'_1$ and $S'_2$ are also located in branches 6.1, 6.2 of resistance switching circuit 6.

Since, during the discharge, the on-resistors $R_x$ and $R_y$ are in series with the measuring resistor, the on-resistors $R_x$ and $R_y$ of switches $S_x$ and $S_y$ should be smaller than the resistors of measuring bridge 2, preferably smaller than 10 Ohm in order not to excessively falsify the measurement.

A method for the complete compensation of the on-resistor is described hereinafter.

As both switches $S_x$ and $S_y$ are preferably integrated in a single chip, the on-resistors are very synchronous across the temperature and operating voltage and the relationship $R_x=R_y=R_{xy}$ applies with adequate accuracy throughout the temperature range on choosing the same value for $R_x$ and $R_y$.

For a discharge one of the switches $S_x$ or $S_y$ and one of the switches $S'_1$ or $S'_2$ is always closed.

If e.g. switches $S_x$ and $S_1$ are closed, in parallel to resistor $R_1$ is the series connection of $R_2$, $R_3$ and $R_4$, so this gives a new resulting resistor $R'_1$.

For achieving unit with the above-described standard method, appropriately four new resistors are introduced and result from the unavoidable parallel and series connection of the Wheatstone arrangement:

$$R'_1 = \frac{R_1 \cdot (R_2 + R_3 + R_4)}{R_1 + R_2 + R_3 + R_4} \qquad R'_2 = \frac{R_2 \cdot (R_1 + R_3 + R_4)}{R_1 + R_2 + R_3 + R_4}$$

$$R'_3 = \frac{R_3 \cdot (R_1 + R_2 + R_4)}{R_1 + R_2 + R_3 + R_4} \qquad R'_4 = \frac{R_4 \cdot (R_1 + R_2 + R_3)}{R_1 + R_2 + R_3 + R_4}$$

Using the same measuring sequence as above, four times are measured:

$$t_1=(R'_1+R_x+R_k)*C \text{ switches } S_x \text{ and } S_1, \text{ closed}$$

$$t_2=(R'_2+R_x+R_k)*C \text{ switches } S_x \text{ and } S_2, \text{ closed}$$

$$t_3=(R'_3+R_y)*C \text{ switches } S_y \text{ and } S_1, \text{ closed}$$

$$t_4=(R'_4+R_y)*C \text{ switches } S_y \text{ and } S_2, \text{ closed}$$

During the measurement the measuring resistors $R'_1$ and $R'_2$ are connected in series in addition to the on-resistor $R_x$ and compensating resistor $R_k$ correspondingly only the on-resistor $R_y$ is connected in to the measuring resistors $R'_3$ and $R'_4$. The thermally uncompensated results can be determined from the established times $t_1$ to $t_4$.

Through the parallel connection of the three remaining Wheatstone bridge resistors with the just measured measuring resistor, the new fundamental resistance drops to ¾ of the rating of the resistors used. The measurable deviation of the resistance change relative to the fundamental resistance is, however, only ⅔ of the deviation of the resistors used, because the three parallel-connected, undesired and parasitic resistances also change with the expansion of their resistance value.

A particular advantage of the present method is the substantial suppression of the stray capacitances of the leads. For the four time measurements the switch of a lead capacitor is twice closed and twice open. For example switch $S_x$ is closed for time measurement $t_1$ and $t_2$ and the lead capacitor is connected to earth. Thus, the interfering influence acts in the same way on two time measurements subsequently brought into relationship. Thus, without further measures being taken, the measured value variation through the lead capacitor is cancelled out.

For the complete temperature compensation of the time measurements the value of the compensating resistor must also be directly measured for the Wheatstone bridge. Here again the sequence is fundamentally identical to the method described relative to FIGS. 1a and 1b. As a result of the parallel connection the resistors $R'_1 \ldots R'_4$ no longer have the same values and expansions as $R_1 \ldots R_4$. Therefore the compensating resistor of the standard Wheatstone bridge no longer automatically has the appropriate magnitude for the method described here. As the compensating resistor measurement is an integral component of the method, the adaptation here must not take place physically through a modification of the resistance value and instead through a subsequent calculation as a mathematical correction factor and therefore extremely inexpensively and precisely. Thus, it is possible to connect commercially available Wheatstone bridges with full temperature compensation without modifications of the inventive method.

The method for determining $R_kC$ is described hereinafter. Subsequently a method for measuring and compensating the switch resistors $R_x$ and $R_y$ is described. This will be followed by the aforementioned determination of the thermally compensated result.

Determination of the Compensating Resistor Without Additional Measurement

For the determination of the time component $R_kC$ of the compensating resistor $R_x$ from the four time measurements $t_1 \ldots t_4$ the same relationships and calculation methods as explained relative to FIGS. 1a and 1b apply to the Wheatstone bridge. Assuming that the on-resistors $R_x$ and $R_y$ are in adequate synchronism, their value is ignored when forming the difference. With the assumption:

$$R_1 + R_2 = R_3 + R_4$$

it is possible to determine the time constant $$t_k = R_k * C = \tfrac{1}{2}((t_1 + t_2) - (t_3 + t_4))$$

Determining the Compensating Resistor/Temperature Measurement with Additional Measurement Once again the time component $R_kC$ is determined from the compensating resistor $R_k$, the on-resistor $R_x$ and the discharge capacitor C.

A further discharge is performed, in that the charged capacitor is simultaneously discharged across switches $S_1$, $S_2$ and $S_x$. As in the standard circuit of FIGS. 1a and 1b, for the discharge resistance there is a parallel connection of resistors $R_1$ and $R_2$, which are jointly connected in series both with the compensating resistor $R_k$ and the switch resistor $R_x$:

$$t_{12} = \left( \frac{R_1 R_2}{R_1 + R_2} + R_k + R_x \right) \cdot C$$

The two resistors $R_3$ and $R_4$ are largely ineffective for the discharge, because at both sides they are at approximately the same potential over switches $S'_1$ and $S'_2$.

The time constant $t_k = R_kC$ is contained in all three measurements and can be determined:

$$t_k = R_k C = 3 \cdot \left( t_{12} - \frac{(5t_1 - t_2)(5t_2 - t_1)}{12 \cdot (t_1 + t_2)} \right) - t_x$$

The formula for $t_k$ is an approximation of the exact solution, which is fully adequate for standard requirements.

The measurement of the time component of on-resistors $R_x$, $R_y$ is explained hereinafter.

Measurement of the On-Resistors of Analog Switches

Figure 3:
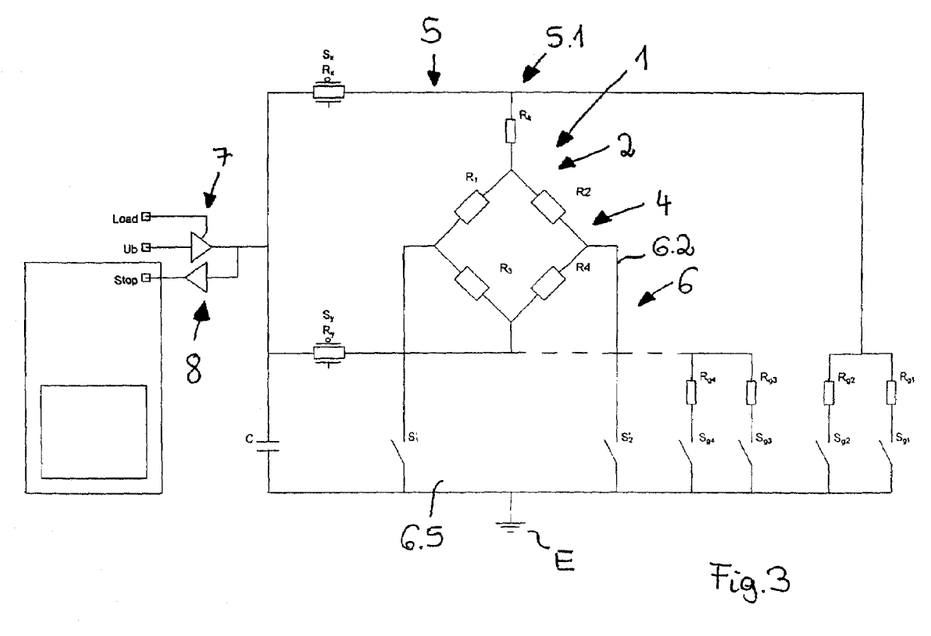
FIG. 3 A further development of the inventive temperature compensation device.

For measuring the on-resistors $R_x$ and $R_y$ of analog switches $S_x$ and $S_y$, discharge resistors $R_{g1}$, $R_{g2}$ are arranged in parallel with one another and in series with analog switch $S_x$ and in series is also associated an electronic switch $S_{g1}$, $S_{g2}$. The same applies for analog switch $S_y$ with discharge resistors $R_{g3}$, $R_{g4}$ and switches $S_{g3}$, $S_{g4}$, which are in each case in series with the discharge resistor. Resistors $R_x$ and $R_y$ and their temperature variation pass additively with time component $R_xC$ into the measured times $t_1$ and $t_4$ and with the time component $R_yC$ into times $t_2$, $t_3$. Therefore the switch resistance has a slight reduction of the span and in particular an additional temperature variation (and operating voltage dependence) of the measured results.

If the two analog switches are placed in a casing as double switches, the temperature variation of both switches has very good synchronism (deviation <5%). Thus, it is sufficient in most cases to compensate both switches with the measurement of one switch resistance and then the following applies:

$$R_{xy} = R_x = R_y$$

For this case it is not necessary to connect four discharge resistors for the measurement of the two analog switches and instead two resistors, e.g. $R_{g1}$, $R_{g2}$ are sufficient. The result is then used for the unmeasured analog switches. Therefore the connection of $S_y$ to discharge resistors $R_{g3}$, $R_{g4}$ is shown in broken line form, because it is optional and not necessary.

Numerous variants are possible for compensating the switch resistors. As for the compensating resistor, once again the running time component $R_xC$ is determined from the switch resistor $R_x$ and discharge capacitor C.

Performing the Measurement with Additional Resistors

As shown in FIG. 3, without Wheatstone bridge modifications, two additional resistors $R_{g1}$, $R_{g2}$ can be connected to the electronics at the connection point of $S_x$ or $R_x$ of the measuring bridge. Therefore three time measurements can be performed:

$$t_{g1} = (R_{g1} + R_x) * C$$

$$t_{g2} = (R_{g2} + R_x) * C$$

$$t_{g1-g2} = \left( \frac{R_{g1} R_{g2}}{R_{g1} + R_{g2}} + R_x \right) \cdot C$$

Time component $t_x = R_xC$ is contained in all three measurements and can be calculated. The formula is an approximation of the exact solution, whose accuracy is completely adequate:

$$t_x = R_x C = 2 \cdot \left( t_{g1-g2} - \frac{t_{g1} t_{g2}}{t_{g1} + t_{g2}} \right)$$

Optionally and as shown above, the on-resistor $R_y$ can be directly measured with two additional resistors. The sequence of the measurement and the evaluation are identical. With the time component $R_yC$ it is possible to improve the evaluations, so that it is no longer necessary to have a synchronous behaviour of on-resistors $R_x$ and $R_y$. However, the advantages are so limited that, as stated, there is no need to use the same, but they are available in optional form.

Performing the Measurement Without Additional Resistors

It is alternatively possible to determine the running time component $t_y$ and resistors $R_{g3}$ and $R_{g4}$.

The sequence is identical to that described relative to FIGS. 1a and 1b. The additional discharge is performed here across switches S', S' and $S_y$. Since in this discharge arrangement there is no compensating resistor in series, only the time component $R_y C$ of switch $S_y$ is measured.

The additional time measurement is then $$t_{34} = \left( \frac{R_3 R_4}{R_3 + R_4} + R_y \right) \cdot C$$

With the measurements $t_3$, $t_4$ and $t_{34}$ it is possible to determine time component $t_y = R_y C$, with reference to the restrictions mentioned relative to FIGS. 1a and 1b:

$$t_y = R_y C = 3 \cdot \left( t_{34} - \frac{(5t_3 - t_4)(5t_4 - t_3)}{12 \cdot (t_3 + t_4)} \right)$$

The formula for $t_y$ is an approximation of the exact solution, which is completely adequate for standard requirements. However, for this variant, use must be made of the good synchronism characteristics of $R_x = R_y = R_{xy}$.

Balancing the Temperature Variation with Mathematical Methods

Hereinafter is provided a joint evaluation of the developments of the method described in conjunction FIGS. 1a and 1b on the one hand and FIGS. 2 and 3 on the other, because there are only minor differences in the evaluation. It will firstly be shown how the time measurements are freed from the influence of the additional resistors ($R_k$, $R_x$, $R_y$) Subsequently the compensating method for balancing the thermal span and offset error will be described.

The time components of compensating resistor $R_k$ and on-resistors $R_x$ and $R_y$ are contained in the four time measurements of the bridge resistors. In the case of the Wheatstone bridge with switches $S_1$ to $S_4$ according to FIGS. 1a and 1b, $t_x$ and $t_y$ are replaced:

$t'_1 = t_1 - t_x - t_k$ $t'_2 = t_2 - t_x - t_k$ $t'_3 = t_3 - t_y$ $t'_4 = t_4 - t_y$

For the development of FIG. 1a, 1b: $t_x = 0$ $t_y = 0$ and for FIGS. 2, 3: $t_{x,y}$, as described relative to these drawings.

The influence of the resistances on the measuring times of the bridge resistors is completely eliminated by simply subtracting the previously determined time component $t_k$, $t_x$, as described relative to both FIGS. 1a and 1b and FIGS. 2 and 3, and $t_y$, as described relative to FIGS. 2 and 3. The effectiveness of this procedure has been adequately confirmed by testing. The relative unbalance $\Delta^R/_R$ of bridge resistors $R_1$ to $R_4$ is now calculated by the ration formation of the compensated times and subsequent subtraction:

$$\left( \frac{\Delta R}{R} \right)_{compensated} = \frac{t'_1}{t'_2} - \frac{t'_3}{t'_4}$$

The relative unbalance $(\Delta^R/_R)_{compensated}$ is completely freed from the influence of compensating resistor $R_k$ and on-resistors $R_x$ and $R_y$ on the span and temperature variation. Thus, the ratio $(\Delta^R/_R)_{compensated}$ includes the deviation and temperature variation of the Wheatstone bridge without applied compensating resistor $R_k$. Hereinafter is shown the modification of the formula with $t_k$ in order to achieve the complete compensation of the temperature variation of the Wheatstone bridge.

If the aforementioned balancing condition is fulfilled for the bridge resistors $R_1$ to $R_4$ and the bridge resistors are non-unbalanced or the measuring bridge is not loaded, also in the case of this ratio $(\Delta^R/_R)_{compensated}$ the thermal output signal is suppressed in the same way as in the known Wheatstone bridge. The unavoidable offset shift of the zero point plays no part, because as yet there is no span compensation.

Adaptation $R_k$ for Span Error Compensation

When resistor $R_k$ has been determined, it can be multiplied in a connecting circuit and therefore adapted. A corrected compensation can be carried out with the thus adapted value. This provides a very elegant possibility of subsequently modifying the compensating resistance and therefore e.g. correct faulty balancing in production or in general so as to simplify production, in that use is only made of a roughly adapted compensating resistance and the latter is then subsequently adapted by software. This is an elegant solution for saving production costs, without additional expenditure.

The balancing instruction for compensating the span error in the measuring bridge output signal is:

$$\left( \frac{\Delta R}{R} \right) = \left( \frac{t'_1}{t'_2} - \frac{t'_3}{t'_4} - TkO \right) \frac{1}{1 + TkS \frac{2 \cdot t_k}{t'_1 + t'_2}}$$

In the case of a Wheatstone bridge with a conventionally adapted compensating resistor $R_k$, the correction factor of the temperature compensation of the span TkS is:

For the development of FIGS. 1a and 1b: TkS=1,

For the development of FIGS. 2 and 3: TkS=¾.

The unavoidable offset value TkO of the non-unbalanced, unloaded bridge is subtracted, so that the result of the unloaded bridge within the brackets is in fact zero over the entire temperature range. With such a subtraction it is possible to do without the balancing resistors for bridge zero balancing hitherto conventional with such bridges. With the temperature-dependent correction break the temperature variation of the span is compensated, without producing an additional temperature variation at the zero point.

Balancing, which in the known and generally used method has to take place during the production of the measuring bridge, can now be carried out in a comparable manner with the downstream, mathematical determination. Whereas hitherto balancing of the non-unbalanced, unloaded bridge voltage took place to zero volt, according to the invention the balancing of the non-unbalanced, unloaded bridge result dR/R takes place by subtraction of TkO to zero.

Whereas hitherto the application of the appropriate compensating resistor was necessary for compensating the bridge output signal, according to the invention the appropriate TkS is used for the thermal compensation of the bridge output signal.

By small variations of TkO and TkS it is possible to fully compensate a possible residual temperature variation of a bridge by means of mathematical adaptation.

LIST OF REFERENCE NUMBERS

1 Device
2 Measuring bridge/Wheatstone bridge
3, 4 Resistance switching circuit
5 Input voltage circuit
5.1 Input branch
5.2 Output branch
6 Resistance switching circuit branch
6.1, 6.2, 6.3, 6.4 Lines
6.5 Earth line
7 Threshold switch
C Capacitor
R1, R2, R3, R4 Resistors
R'1, R'2, R'3, R'4 Resistors
Rg1, Rg2, Rg3, Rg4 Discharge resistors
Rk Compensating resistor
Rx, Ry Internal resistors
RyC Time component
S1, S2, S3, S4 Switches
S'1, S'2, Sg1, Sg2
Sg3, Sg4 Switches
Sx, Sy Analog switches
t1, t2; t3, t4, t12,
t34, t'1, t'2, t'3,
t'4 Discharge times
tk, tx, ty Time component

What is claimed is:

1. A method for the temperature compensation of a resistance measuring bridge, the method comprising:
   providing an input circuit and a resistance measuring bridge having at least one resistor and a resistance switching circuit;
   positioning a capacitor in parallel with the input circuit and the resistance switching circuit; and
   placing a compensating resistor in series with the at least one resistor, the at least one resistor and the compensating resistor successively discharging the capacitor;
   compensating the temperature-dependent span error in the output signal of the resistance measuring bridge according to $$\left(\frac{\Delta R}{R}\right)_{span\ compensated} = \left(\frac{t'_1}{t'_2} - \frac{t'_3}{t'_4} - TkO\right) \frac{1}{1 + TkS \frac{2 \cdot t_k}{t'_1 + t'_2}}$$

in which $t'_1$, $t'_2$, $t'_3$, $t'_4$ are the discharge times of the capacitor across at least one of the resistors of the resistance measuring bridge, TkO the offset error of the non-unbalanced, unloaded measuring bridge, TkS a correction factor for the span error of the resistance measuring bridge and $t_k$ the discharge time component of a compensating resistor ($R_k$) located in the input circuit of the resistance measuring bridge.

2. A method according to claim 1, wherein the capacitor is discharged until a switching threshold of a threshold switch is reached.

3. A method according to claim 1, wherein the discharge times of the capacitor are determined across the individual resistors of the measuring bridge.

4. A method according to claim 3, wherein the relative unbalance of the resistors $((\Delta R/R)_{compensated})$ of the measuring bridge is determined by $$\left(\frac{\Delta R}{R}\right)_{compensated} = \frac{t'_1}{t'_2} - \frac{t'_3}{t'_4}$$

in which $t'_1$, $t'_2$, $t'_3$, $t'_4$ are the discharge times or discharge time components of the capacitor across at least one of the resistors of the measuring bridge.

5. A method according to claim 1, wherein the correction factor TkS for the span error of the resistance measuring bridge is between ¾ and 1.

6. A method according to claim 1, wherein the discharge time components of at least one of the resistors of the resistance measuring bridge are determined by subtraction of discharge time components of compensating resistors and possible resistors of analog switches over which the discharges have taken place during the measurement of discharge times across resistors of the resistance measuring bridge.

7. A method for the temperature compensation of a resistance measuring bridge, the method comprising:
   providing an input circuit and a resistance measuring bridge having at least one resistor and a resistance switching circuit;
   positioning a capacitor in parallel with the input circuit and the resistance switching circuit;
   placing a compensating resistor in series with the at least one resistor, the at least one resistor and the compensating resistor successively discharging the capacitor;
   determining discharge times across one resistor of the resistance measuring bridge in series with a compensating resistor and determining discharge times across another resistor of the resistance measuring bridge;
   discharging additionally the capacitor across the compensating resistor and the parallel-connected resistors of the resistance measuring bridge in series therewith;
   determining a compensating time constant of the compensating resistor according to $$t_k = R_k C = 2 \cdot \left(t_{12} - \frac{t_1 t_2}{t_1 + t_2}\right).$$

8. A method according to claim 7, wherein the discharge time $$t_{12} = \left(\frac{R_1 R_2}{R_1 + R_2} + R_k\right) \cdot C$$

is measured across the compensating resistor and the parallel-connected resistors of the resistance measuring bridge in series therewith.

9. A method for the temperature compensation of a resistance measuring bridge, the method comprising:

providing an input circuit and a resistance measuring bridge having at least one resistor and a resistance switching circuit;

positioning a capacitor in parallel with the input circuit and the resistance switching circuit;

placing a compensating resistor in series with the at least one resistor, the at least one resistor and the compensating resistor successively discharging the capacitor;

a capacitor placed between the input circuit and the switching circuit of the resistance measuring bridge is successively discharged across a resistor of the resistance measuring bridge and resistors of the resistance measuring bridge parallel thereto and an analog switch in series with the resistance measuring bridge;

the capacitor is additionally discharged across the compensating resistor, an analog switch with an on-resistor and the parallel-connected resistors in series therewith;

the discharge time is determined according to $$t_{12} = \left(\frac{R_1 R_2}{R_1 + R_2} + R_k + R_x\right) \cdot C$$

the time constant of the compensating resistor is determined according to $$t_k = R_k C = 3 \cdot \left(t_{12} - \frac{(5t_1 - t_2)(5t_2 - t_1)}{12 \cdot (t_1 + t_2)}\right) - t_x.$$

10. A method according to claim 9, wherein the discharge times are determined according to $t_1 = (R'_1 + R_x R_k)^* C$ Switches $S_x$ and $S_1$, closed $t_2 = (R'_2 + R_x + R_k)^* C$ Switches $S_x$ and $S_2$, closed $t_3 = (R'_3 + R_y)^* C$ Switches $S_y$ and $S_1$, closed $t_4 = (R'_4 + R_y)^* C$ Switches $S_y$ and $S_2$, closed in which $$R'_1 = \frac{R_1 \cdot (R_2 + R_3 + R_4)}{R_1 + R_2 + R_3 + R_4} \quad R'_2 = \frac{R_2 \cdot (R_1 + R_3 + R_4)}{R_1 + R_2 + R_3 + R_4}$$

$$R'_3 = \frac{R_3 \cdot (R_1 + R_2 + R_4)}{R_1 + R_2 + R_3 + R_4} \quad R'_4 = \frac{R_4 \cdot (R_1 + R_2 + R_3)}{R_1 + R_2 + R_3 + R_4}.$$

11. A method according to claim 9, wherein the capacitor across an analog switch with an on-resistor and parallel connected resistors of the resistance measuring bridge in series therewith is measured.

12. A method according to claim 11, wherein the discharge time across the capacitor over an analog switch with an on-resistor and parallel resistors of the resistance measuring bridge in series therewith is measured according to $$t_{34} = \left(\frac{R_3 R_4}{R_3 + R_4} + R_1\right) \cdot C.$$

13. A method for the temperature compensation of a resistance measuring bridge, the method comprising:

providing an input circuit and a resistance measuring bridge having at least one resistor and a resistance switching circuit;

positioning a capacitor in parallel with the input circuit and the resistance switching circuit;

placing a compensating resistor in series with the at least one resistor, the at least one resistor and the compensating resistor successively discharging the capacitor;

a capacitor placed between the input circuit and the switching circuit of the resistance measuring bridge is successively discharged across a resistor of the resistance measuring bridge and resistors of the resistance measuring bridge parallel thereto and an analog switch in series with the resistance measuring bridge;

the capacitor is additionally discharged across the compensating resistor, an analog switch with an on-resistor and the parallel-connected resistors in series therewith;

the capacitor is discharged across at least one analog switch with an on-resistor and successively with one of two discharge resistors in series connection therewith;

the discharge time of the capacitor across an analog switch with an on-resistor and two parallel-connected discharge resistors in series therewith is measured;

the discharge time of the capacitor across at least one analog switch with an on-resistor and two parallel-connected discharge resistors in series therewith is measured according to $$t_{g1-g2} = \left(\frac{R_{g1} R_{g2}}{R_{g1} + R_{g2}} + R_x\right) \cdot C.$$

14. A method according to claim 13, wherein the discharge times $t_{g1} = (R_{g1} + R_x)^* C$ $t_{g2} = (R_{g2} + R_x)^* C$ are measured.

15. A method according to claim 13, wherein the discharge times are determined according to $t_1 = (R'_1 + R_x R_k)^* C$ Switches $S_x$ and $S_1$, closed $t_2 = (R'_2 + R_x + R_k)^* C$ Switches $S_x$ and $S_2$, closed $t_3 = (R'_3 + R_y)^* C$ Switches $S_y$ and $S_1$, closed $t_4 = (R'_4 + R_y)^* C$ Switches $S_y$ and $S_2$, closed in which $$R'_1 = \frac{R_1 \cdot (R_2 + R_3 + R_4)}{R_1 + R_2 + R_3 + R_4} \quad R'_2 = \frac{R_2 \cdot (R_1 + R_3 + R_4)}{R_1 + R_2 + R_3 R_4}$$

$$R'_3 = \frac{R_3 \cdot (R_1 + R_2 + R_4)}{R_1 + R_2 + R_3 + R_4} \quad R'_4 = \frac{R_4 \cdot (R_1 + R_2 + R_3)}{R_1 + R_2 + R_3 + R_4}.$$

16. A method according to claim 13, wherein the capacitor across an analog switch with an on-resistor and parallel connected resistors of the resistance measuring bridge in series therewith is measured.

17. A method for the temperature compensation of a resistance measuring bridge, the method comprising:
   providing an input circuit and a resistance measuring bridge having at least one resistor and a resistance switching circuit;
   positioning a capacitor in parallel with the input circuit and the resistance switching circuit;
   placing a compensating resistor in series with the at least one resistor, the at least one resistor and the compensating resistor successively discharging the capacitor;
   a capacitor placed between the input circuit and the switching circuit of the resistance measuring bridge is successively discharged across a resistor of the resistance measuring bridge and resistors of the resistance measuring bridge parallel thereto and an analog switch in series with the resistance measuring bridge;
   the capacitor is additionally discharged across the compensating resistor, an analog switch with an on-resistor and the parallel-connected resistors in series therewith;
   the capacitor is discharged across at least one analog switch with an on-resistor and successively with one of two discharge resistors in series connection therewith;
   the discharge time component across the on-resistor of the analog switch is determined according to $$t_x = R_x C = 2 \cdot \left( t_{g1-g2} - \frac{t_{g1} t_{g2}}{t_{g1} + t_{g2}} \right).$$

18. A method according to claim 17, wherein the discharge time component of the on-resistor of the analog switch is determined according to $$t_y = R_y C = 3 \cdot \left( t_{34} - \frac{(5t_3 - t_4)(5t_4 - t_3)}{12 \cdot (t_3 + t_4)} \right).$$

19. A method according to claim 17, wherein the discharge times $$t_{g1} = (R_{g1} + R_x) * C$$

$$t_{g2} = (R_{g2} + R_x) * C$$

are measured.

20. A device for temperature compensation of a measuring bridge, the device comprising:
   a measuring bridge having a resistance switching circuit branch, said resistance switching circuit branch comprising a switch, said switch contacting said measuring bridge in a first position and said switch being disconnected from said measuring bridge in a second position;
   an input circuit;
   a compensating resistor connected to said input circuit and connected in series with said measuring bridge;
   a capacitor located in parallel with said input circuit and said resistance switching circuit branch;
   compensating means compensating the temperature-dependent span error in the output signal of the resistance measuring bridge according to $$\left( \frac{\Delta R}{R} \right) \text{span compensated} = \left( \frac{t'_1}{t'_2} - \frac{t'_3}{t'_4} - TkO \right) \frac{1}{1 + TkS \frac{2 \cdot t_k}{t'_1 + t'_2}}$$

in which $t'_1, t'_2, t'_3, t'_4$ are the discharge times of the capacitor across at least one of the resistors of the resistance measuring bridge, TkO the offset error of the non-unbalanced, unloaded measuring bridge, TkS a correction factor for the span error of the resistance measuring bridge and $t_k$ the discharge time component of a compensating resistor ($R_k$) located in the input circuit of the resistance measuring bridge.

21. A device according to claim 20, wherein an analog switch is located within said input circuit between a voltage supply and the measuring bridge.

22. A device according to claim 21, wherein at least one analog switch is in series with discharge resistors and discharge switches.

23. A device according to claim 21, wherein at least one analog switch is in series with two parallel discharge resistors, each parallel discharge resistor being in series with a switch.

24. A device according to claim 20, wherein each resistor of the measuring bridge is connected in series with a switch of a branch of the resistance switching circuit branch.

25. A device according to claim 20, wherein a switchable voltage supply is connected to said input circuit.

26. A device according to claim 20, wherein a threshold switch is associated with the capacitor.

27. A device according to claim 20, wherein an evaluating circuit evaluates measured discharge times for the temperature compensation of the measuring bridge.

28. A method for the temperature compensation of a resistance measuring bridge, the method comprising:
   providing an input circuit and a resistance measuring bridge having at least one resistor and a resistance switching circuit;
   positioning a capacitor in parallel with the input circuit and the resistance switching circuit;
   placing a compensating resistor in series with the at least one resistor, the at least one resistor and the compensating resistor successively discharging the capacitor;
   determining discharge times across one resistor of the resistance measuring bridge in series with a compensating resistor and determining discharge times across another resistor of the resistance measuring bridge;
   determining the time constant of the compensating resistor according to $$t_k = R_k * C = 1/2((t_1 + t_2) - (t_3 + t_4)).$$

29. A method according to claim 28, wherein the capacitor is discharged until a switching threshold of a threshold switch is reached.

30. A method according to claim 28, wherein the discharge times of the capacitor are determined across the individual resistors of the measuring bridge.

31. A method according to claim 28, wherein a relative unbalance of the resistors $((\Delta R/R)_{compensated})$ of the measuring bridge is determined by $$\left( \frac{\Delta R}{R} \right) \text{compensated} = \frac{t'_1}{t'_2} - \frac{t'_3}{t'_4}$$

in which $t'_1, t'_2, t'_3, t'_4$ are the discharge times or discharge time components of the capacitor across at least one of the resistors of the measuring bridge.

32. A method according to claim 28, wherein the discharge time components of at least one of the resistors of the resistance measuring bridge are determined by subtraction of discharge time components of compensating resistors and possible resistors of analog switches over which the discharges have taken place during the measurement of discharge times across resistors of the resistance measuring bridge.

* * * * *